(12) United States Patent
Son et al.

(10) Patent No.: US 11,343,914 B2
(45) Date of Patent: May 24, 2022

(54) ELECTRONIC DEVICE INCLUDING CONDUCTIVE MEMBER FORMING CAPACITIVE COUPLING WITH BRACKET AND ELECTRICALLY CONNECTED TO GROUNDS OF PLURALITY OF CIRCUIT BOARDS DISPOSED IN THE BRACKET

(71) Applicant: Samsung Electronics Co., Ltd., Suwon-si (KR)

(72) Inventors: Wangik Son, Suwon-si (KR); Minho Kim, Suwon-si (KR); Sunghyun Kim, Suwon-si (KR); Eungwon Kim, Suwon-si (KR); Chanbeom Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 290 days.

(21) Appl. No.: 16/281,702

(22) Filed: Feb. 21, 2019

(65) Prior Publication Data

US 2019/0261515 A1   Aug. 22, 2019

(30) Foreign Application Priority Data

Feb. 21, 2018 (KR) .................. 10-2018-0020433

(51) Int. Cl.
*H05K 1/14* (2006.01)
*H01R 4/04* (2006.01)
(Continued)

(52) U.S. Cl.
CPC .............. *H05K 1/144* (2013.01); *H01R 4/04* (2013.01); *H01R 12/51* (2013.01); *H05K 1/0215* (2013.01);
(Continued)

(58) Field of Classification Search
CPC .... H05K 1/0259; H05K 1/0257; H05K 1/144; H05K 1/145; H05K 3/32; H05F 3/02
(Continued)

(56) References Cited

U.S. PATENT DOCUMENTS 4,967,316 A    10/1990  Goebel et al.
5,576,325 A *  11/1996  Williams ................ A61P 37/06
                                                        514/291

(Continued)

FOREIGN PATENT DOCUMENTS

EP    3 060 033 A1   8/2016
GB    2 320 619 A    6/1998
(Continued)

OTHER PUBLICATIONS

European Search Report dated Jul. 16, 2019, issued in European Patent Application No. 19158527.2.

*Primary Examiner* — Thienvu V Tran
*Assistant Examiner* — Nusrat Quddus
(74) *Attorney, Agent, or Firm* — Jefferson IP Law, LLP

(57) ABSTRACT

An electronic device is provided. The electronic device includes a conductive support member, a first circuit board connected to the conductive support member by a first capacitor, a second circuit board connected to the conductive support member by a second capacitor, a first conductive connection member electrically connecting the first circuit board and the second circuit board, and a first ground structure, at least a portion of the first ground structure being interposed between the first conductive connection member and the conductive support member. The ground structure includes a non-conductive layer physically contacting the conductive support member, and a conductive layer electri-
(Continued)

cally connected to the first conductive connection member to form a capacitive coupling with the conductive support member.

21 Claims, 8 Drawing Sheets

(51) Int. Cl.
    *H01R 12/51*     (2011.01)
    *H05K 1/02*     (2006.01)
    *H05K 9/00*     (2006.01)
    *H05K 7/14*     (2006.01)

(52) U.S. Cl.
    CPC .......... *H05K 1/0259* (2013.01); *H05K 7/142* (2013.01); *H05K 9/0039* (2013.01); *H05K 1/14* (2013.01)

(58) Field of Classification Search
    USPC ........................................ 361/748, 762, 763
    See application file for complete search history.

(56) References Cited

U.S. PATENT DOCUMENTS

| | | | | |
|---|---|---|---|---|
| 6,009,757 | A * | 1/2000 | LeComte | G01L 9/0075 361/283.4 |
| 6,016,089 | A * | 1/2000 | Goudie | H01R 4/64 333/12 |
| 6,172,881 | B1 | 1/2001 | Hirai | |
| 6,650,203 | B2 * | 11/2003 | Gerstenberg | H05K 1/0216 333/185 |
| 7,708,473 | B2 * | 5/2010 | Tanaka | G02B 6/4201 385/92 |
| 8,525,749 | B2 | 9/2013 | Cho et al. | |
| 9,462,701 | B2 * | 10/2016 | Weichslberger | H05K 3/4015 |
| 2003/0060172 | A1 * | 3/2003 | Kuriyama | H05K 1/0206 455/575.1 |
| 2004/0090748 | A1 * | 5/2004 | Kishimoto | H05K 1/0215 361/719 |
| 2005/0221638 | A1 * | 10/2005 | Berberich | H05K 9/0066 439/76.1 |
| 2008/0112201 | A1 * | 5/2008 | Yahata | H02M 7/003 363/131 |
| 2008/0130223 | A1 * | 6/2008 | Nakamura | H02M 7/003 361/689 |
| 2009/0002974 | A1 * | 1/2009 | Yahata | H02M 7/003 361/820 |
| 2011/0050533 | A1 | 3/2011 | Cho et al. | |
| 2011/0051384 | A1 * | 3/2011 | Kriechbaum | H01L 24/24 361/762 |
| 2012/0127044 | A1 * | 5/2012 | Mashima | H01Q 1/242 343/702 |
| 2014/0160704 | A1 | 6/2014 | Janssen et al. | |
| 2014/0233282 | A1 * | 8/2014 | Ohoka | H02M 1/14 363/39 |
| 2014/0240946 | A1 * | 8/2014 | Fukumasu | B60L 58/20 361/811 |
| 2015/0009642 | A1 * | 1/2015 | Caclard | H05K 5/0047 361/753 |
| 2016/0242291 | A1 * | 8/2016 | Park | H05K 1/0259 |
| 2016/0246445 | A1 * | 8/2016 | Tang | G06F 3/044 |
| 2016/0262259 | A1 * | 9/2016 | Ueyama | G06F 1/182 |
| 2017/0034962 | A1 * | 2/2017 | Yang | G06F 1/185 |
| 2017/0048366 | A1 * | 2/2017 | Jeong | H04M 1/0277 |
| 2017/0358953 | A1 | 12/2017 | Trudeau et al. | |

FOREIGN PATENT DOCUMENTS

| | | | | |
|---|---|---|---|---|
| JP | | 4365229 B2 * | 1/2004 | ............. H05K 1/14 |
| KR | 10-2011-0023127 A | | 3/2011 | |
| WO | 2013/023926 A2 | | 2/2013 | |

* cited by examiner (1) GROUND STRUCTURE    (2) POTENTIAL LEVEL OF EACH AREA

ELECTRONIC DEVICE INCLUDING CONDUCTIVE MEMBER FORMING CAPACITIVE COUPLING WITH BRACKET AND ELECTRICALLY CONNECTED TO GROUNDS OF PLURALITY OF CIRCUIT BOARDS DISPOSED IN THE BRACKET

CROSS-REFERENCE TO RELATED APPLICATION(S)

This application is based on and claims priority under 35 U.S.C. § 119(a) of a Korean patent application number 10-2018-0020433, filed on Feb. 21, 2018, in the Korean Intellectual Property Office, the disclosure of which is incorporated by reference herein in its entirety.

BACKGROUND

1. Field

The disclosure relates to a ground structure of an electronic device including a metal housing.

2. Description of Related Art

Nowadays, an electronic device is being designed to include a metal housing for aesthetic impression or hardness. However, the electronic device including the metal housing may have various issues compared with an electronic device including a housing of an injection structure according to the related art.

The above information is presented as background information only to assist with an understanding of the disclosure. No determination has been made, and no assertion is made, as to whether any of the above might be applicable as prior art with regard to the disclosure.

SUMMARY

An electronic device may include a circuit board (e.g., a printed circuit board (PCB)) and a support member for supporting various parts including the circuit board. For example, an electronic device including a metal housing may include a support member (e.g., a metal bracket or the like). For example, the support member may be integrally formed with the metal housing of the electronic device. In this case, a portion of the metal housing may form the support member. Alternatively, a conductive support member grounded with the metal housing may be disposed within the electronic device including the metal housing. In this case, due to a leakage current, a ground fails to be connected directly between the conductive support member and the circuit board. As such, a ground may be connected between the metallic support member and the circuit board through a capacitor, and capacitances of the conductive support member and the circuit board may be different.

Meanwhile, the electronic device may include a plurality of circuit boards for including various parts. The plurality of circuit boards may be connected by a separate connection member. Grounds respectively included in the plurality of circuit boards may also be electrically connected by the connection member. In this case, it may be different to implement a stable ground connection because the grounds are connected only by the connection member, and the plurality of circuit boards may have different ground potentials. This may cause, for example, the reduction of performance of an antenna within the electronic device.

Aspects of the disclosure are to address at least the above-mentioned problems and/or disadvantages and to provide at least the advantages described below. Accordingly, an aspect of the disclosure is to provide an electronic device having a stable ground structure in a state where the electronic device includes a plurality of circuit boards and a plurality of parts.

Additional aspects will be set forth in part in the description which follows and, in part, will be apparent from the description, or may be learned by practice of the presented embodiments.

In accordance with an aspect of the disclosure, an electronic device is provided. The electronic device includes a conductive support member, a first circuit board connected to the conductive support member by a first capacitor, a second circuit board connected to the conductive support member by a second capacitor, a first conductive connection member electrically connecting the first circuit board and the second circuit board, and a first ground structure, at least a portion of the first ground structure being interposed between the first conductive connection member and the conductive support member. The ground structure may include a non-conductive layer physically contacting the conductive support member, and a conductive layer electrically connected to the first conductive connection member to form a capacitive coupling with the conductive support member.

In accordance with another aspect of the disclosure, an electronic device is provided. The electronic device includes a metal bracket, a first circuit board disposed over a first area of the metal bracket, a second circuit board disposed over a second area of the metal bracket and electrically connected to a connection part of the first circuit board, and a conductive member disposed in the metal bracket to face the connection part in an area where the first area and the second area overlap each other. The conductive member is electrically separated from the metal bracket such that a capacitive coupling is formed between the conductive member and the metal bracket. The conductive member is electrically connected to the connection part such that a first potential difference between a first ground of the first circuit board and the metal bracket and a second potential difference between a second ground of the second circuit board and the metal bracket are substantially identical.

According to various embodiments of the disclosure, an electronic device may have a stable ground structure, and may have an excellent performance with regard to an antenna, a high-frequency noise, and an electrostatic tolerance.

Besides, a variety of effects directly or indirectly understood through this disclosure may be provided.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1A:
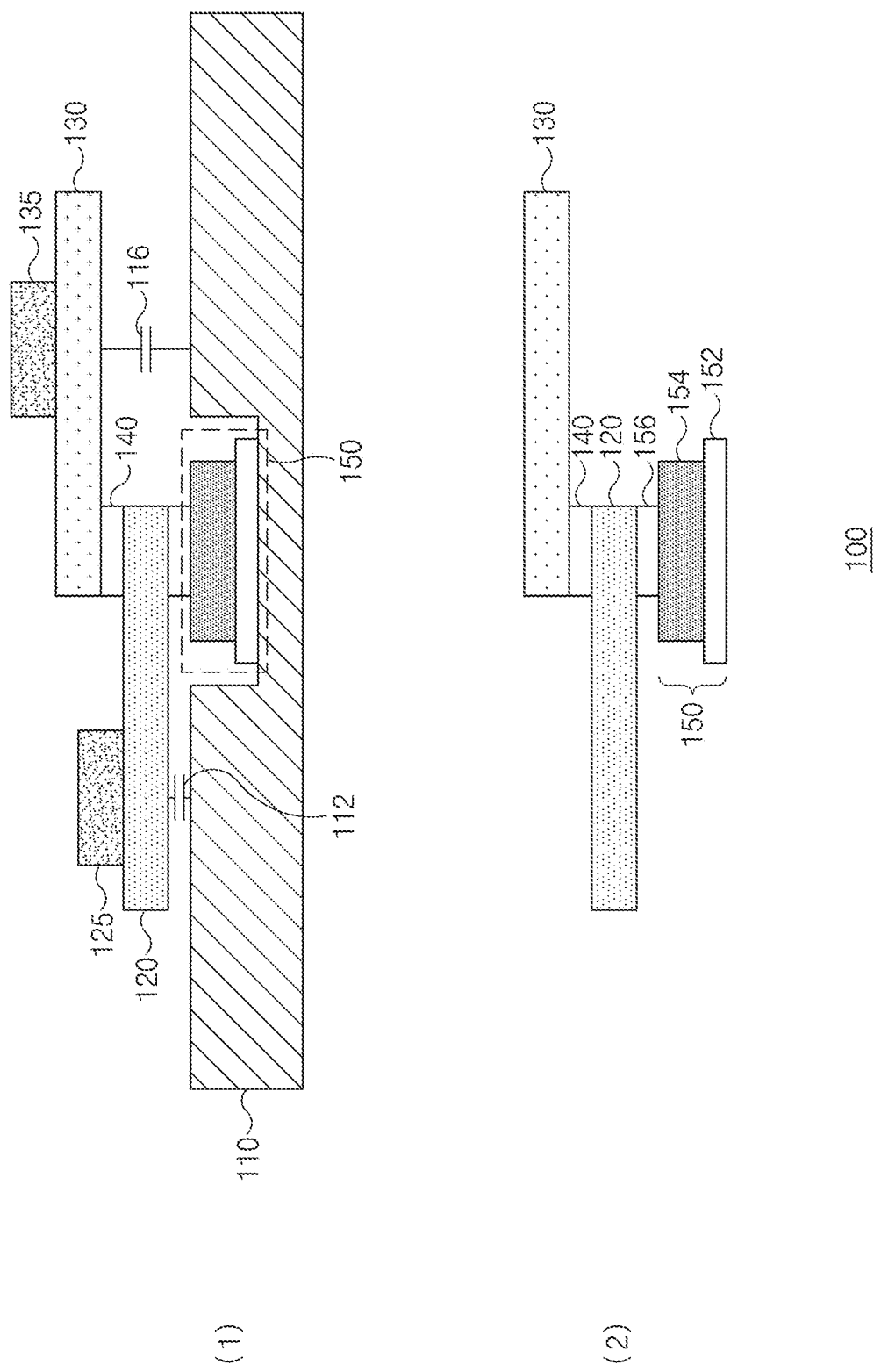
FIG. 1A illustrates an internal structure of an electronic device according to an embodiment of the disclosure.

FIG. 1A illustrates an internal structure of an electronic device according to an embodiment of the disclosure.

Figure 1B:
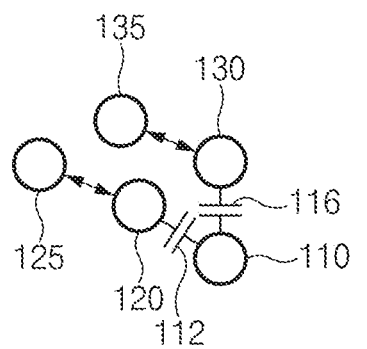
FIG. 1B illustrates a ground structure of an electronic device and potentials of respective ground areas according to an embodiment of the disclosure.
Figure 1B:
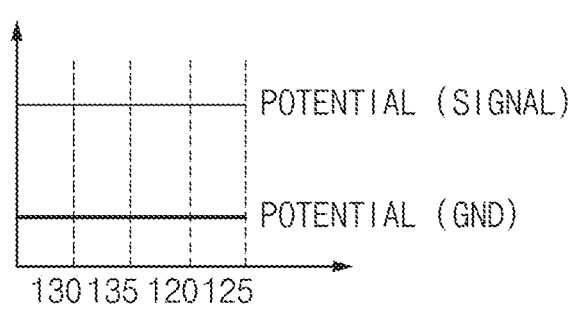

FIG. 1B illustrates a ground structure of an electronic device and potentials of respective ground areas, according to an embodiment of the disclosure.

Referring to FIGS. 1A and 1B, an electronic device 100 according to an embodiment may include a conductive support member 110, a plurality of circuit boards (e.g., a printed circuit board (PCB)), a conductive connection member 140 connecting the plurality of circuit boards, and a ground structure 150 for a ground of the plurality of circuit boards.

In an embodiment, the electronic device 100 may include a conductive housing (not illustrated). For example, the conductive housing may include a front surface, a rear surface facing away from the front surface, and a side surface interposed between the front surface and the rear surface. The conductive support member 110, the plurality of circuit boards, the conductive connection member 140, and the ground structure 150 may be disposed within the conductive housing.

In an embodiment, the conductive support member 110 may support structures within the electronic device 100. For example, the conductive support member 110 may be referenced as a metal bracket.

Referring to (1) of FIG. 1A, in an embodiment, the plurality of circuit boards may include a first circuit board 120 and a second circuit board 130. The first circuit board 120 may be connected to the conductive support member 110 by a first capacitor 112. The second circuit board 130 may be connected to the conductive support member 110 by a second capacitor 116. For example, the first capacitor 112 and the second capacitor 116 may prevent a short circuit of a leakage current.

In an embodiment, the first circuit board 120 and the second circuit board 130 may be electrically connected by the conductive connection member 140. For example, internal parts disposed in the first circuit board 120 and internal parts disposed in the second circuit board 130 may exchange signals (e.g., a control signal of an application processor (AP) and a radio frequency (RF) signal of a communication circuit) with each other through the conductive connection member 140. For example, the conductive connection member 140 may be referenced as a connector. Below, the conductive connection member 140 may be referred to as a "connector" according to one example.

In an embodiment, the electronic device 100 may include the ground structure 150, at least a portion of which is interposed between the conductive connection member 140 and the conductive support member 110. The ground structure 150 may include a non-conductive layer 152 and a conductive layer 154. The non-conductive layer 152 may physically contact the conductive support member 110. The non-conductive layer 152 may electrically separate the conductive support member 110 and the conductive layer 154. The conductive layer 154 may be electrically connected to the conductive connection member 140. For example, the conductive layer 154 of the ground structure 150 may electrically contact the conductive connection member 140 by a conductive tape 156. For example, a high-frequency noise or an electrostatic discharge (ESD) may occur in an area in which the first circuit board 120 and the second circuit board 130 are connected by the conductive connection member 140. The high-frequency noise or static electricity may be discharged to the conductive support member 110 through a capacitive coupling between the ground structure 150 and the conductive support member 110.

In an embodiment, as the ground structure 150 electrically contacts the conductive support member 110, an effect similar to the connection of the first circuit board 120 and the second circuit board 130 with the conductive support member 110 through capacitors may be obtained. Below, the ground structure 150 and the conductive support member 110 may be understood as forming the capacitive coupling.

Referring to (2) of FIG. 1A, the ground structure 150 may have a structure in which a plurality of layers are stacked and disposed. For example, the conductive layer 154 may be stacked and disposed on the non-conductive layer 152.

For example, the conductive tape 156 may be attached to and disposed on the first circuit board 120. For another example, the conductive tape 156 may be stacked and disposed on the conductive layer 154. In this case, the ground structure 150 may include the conductive tape 156.

In various embodiments, the ground structure 150 may be formed with a size which allows the first circuit board 120 and the second circuit board 130 to have substantially the same ground potential (or to become equipotential). For example, the area of a plurality of layers included in the ground structure 150 may be experimentally determined according to characteristics of circuit boards disposed within the electronic device 100.

In various embodiments, the conductive support member 110 may include a recess corresponding to the ground structure 150. The ground structure 150 may be placed in the recess. A size of the recess may correspond to a size of the ground structure 150.

In various embodiments, various different parts may be disposed on the plurality of circuit boards (e.g., the first and second circuit boards 120 and 130). For example, the electronic device 100 may further include a first part 125 disposed on the first circuit board 120 and a second part 135 disposed on the second circuit board 130. The first part 125 may be electrically connected to a first ground area (not illustrated) within the first circuit board 120. The second part 135 may be electrically connected to a second ground area (not illustrated) within the second circuit board 130. The first ground area and the second ground area may be electrically connected by the conductive connection member 140.

Referring to (1) of FIG. 1B showing a ground structure, the first part 125 may be electrically connected directly to the first ground area of the first circuit board 120, and the second part 135 may be electrically connected directly to the second ground area of the second circuit board 130. The first circuit board 120 may be connected to the conductive support member 110 by the first capacitor 112, and the second circuit board 130 may be connected to the conductive support member 110 by the second capacitor 116. Although not illustrated in drawings, the first circuit board 120 and the second circuit board 130 may be electrically connected by the conductive connection member 140, and at least a portion of the conductive connection member 140 may be electrically connected to the ground structure 150.

Referring to (2) of FIG. 1B showing potentials of respective areas, the first circuit board 120, the first part 125, the second circuit board 130, and the second part 135 may have substantially the same ground potential.

In various embodiments, the ground structure 150 may be formed with a size which allows the first circuit board 120, the first part 125, the second circuit board 130, and the second part 135 to have substantially the same ground potential (or to become equipotential). For example, the area of a plurality of layers included in the ground structure 150 may be experimentally determined according to characteristics of circuit boards and parts disposed within the electronic device 100.

Figure 1C:
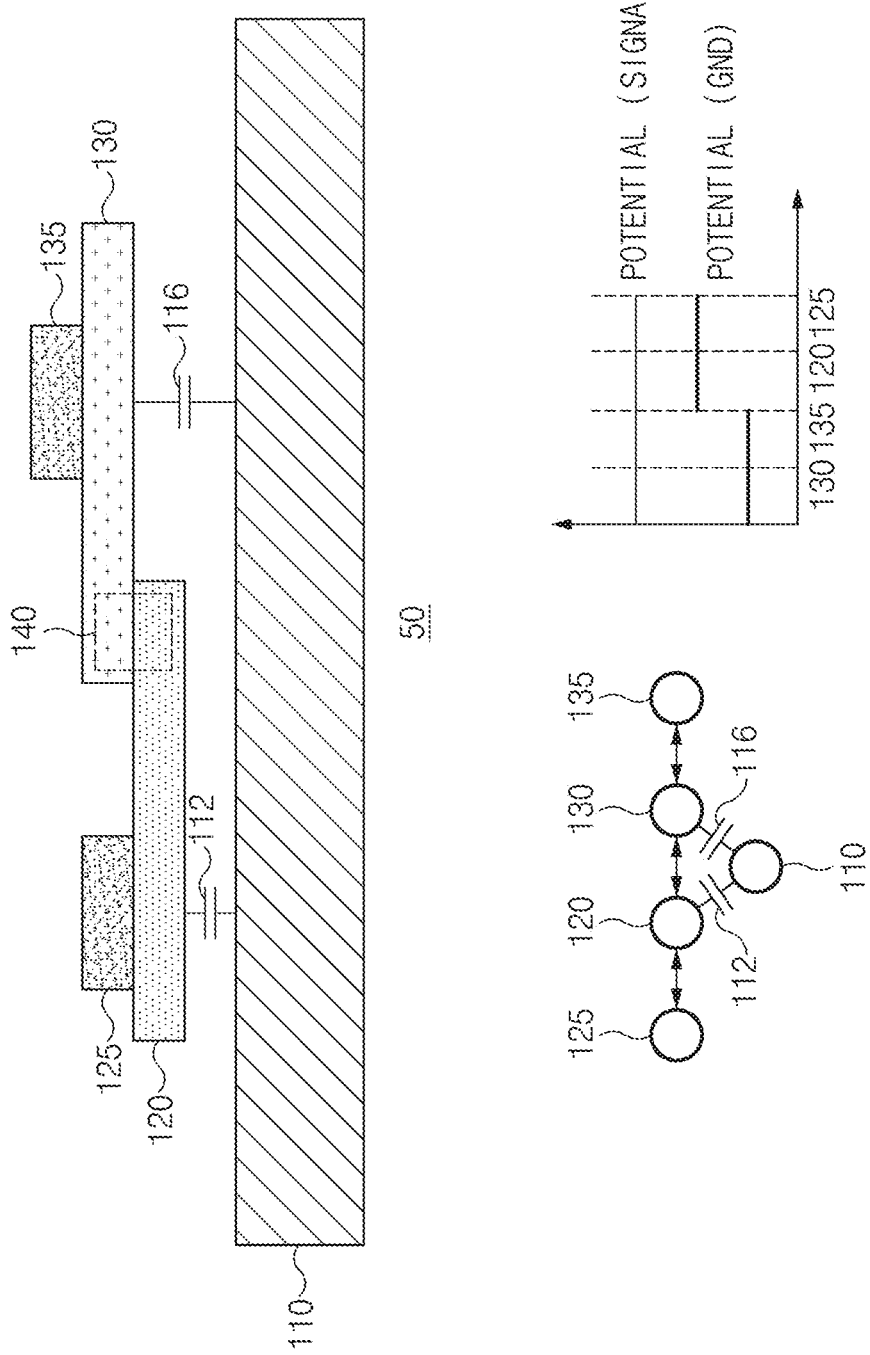
FIG. 1C illustrates an internal structure of an electronic device from which a ground structure is absent and illustrates potentials of ground areas according to an embodiment of the disclosure.

FIG. 1C illustrates an internal structure of an electronic device from which a ground structure is absent and potentials of ground areas, according to an embodiment of the disclosure.

Referring to FIG. 1C, a structure of an electronic device 50 may be referenced as a structure in which the ground structure 150 is excluded from the electronic device 100 described with reference to FIG. 1A.

Referring to (1) of FIG. 1C showing a ground structure of the electronic device 50, the first part 125 may be electrically connected directly to the first ground area of the first circuit board 120, and the second part 135 may be electrically connected directly to the second ground area of the second circuit board 130. The first circuit board 120 may be connected to the conductive support member 110 by the first capacitor 112, and the second circuit board 130 may be connected to the conductive support member 110 by the second capacitor 116. The first circuit board 120 and the second circuit board 130 may be connected by the conductive connection member 140.

Referring to (2) of FIG. 1C showing potentials of respective areas, the first circuit board 120 and the first part 125 may have almost the same ground potential, and the second circuit board 130 and the second part 135 may have almost the same ground potential. However, the first circuit board 120 and the second circuit board 130 may have different ground potentials. In the electronic device 50, since grounds of respective areas are connected only by the conductive connection member 140 and the first and second capacitors 112 and 116, it is difficult to form a stable ground structure. For example, in the case where a part (e.g., an antenna module or an RF circuit) associated with an antenna is included in the first circuit board 120 and/or the second circuit board 130, it may be difficult to optimize the performance of the antenna.

It may be understood from FIGS. 1B and 1C that a ground structure of the electronic device 100 may be stably formed by the ground structure 150 according to the disclosure.

Figure 2A:
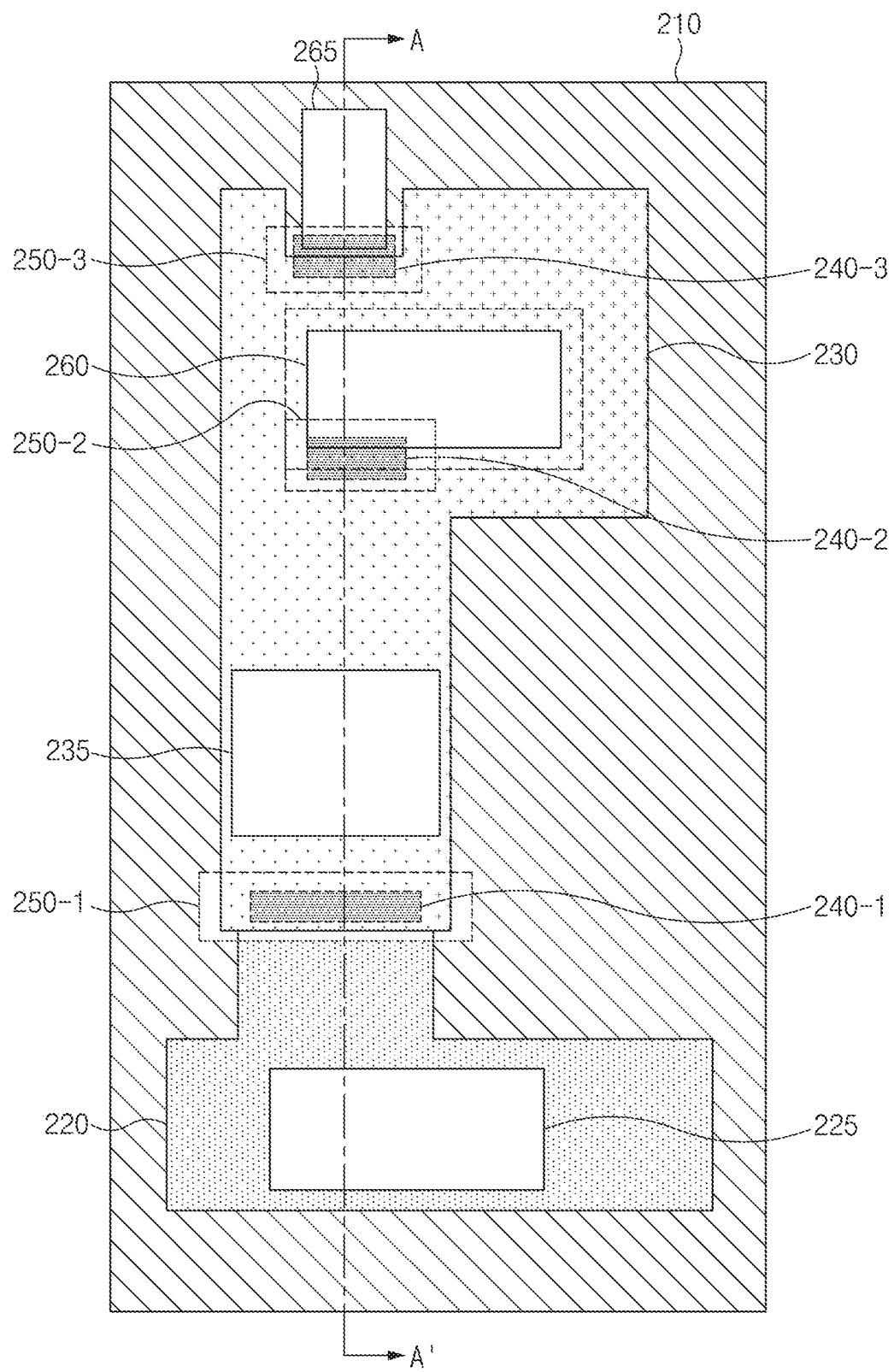
FIG. 2A is a top view of a conductive support member included in an electronic device according to an embodiment of the disclosure.

FIG. 2A illustrates a top view of a conductive support member included in an electronic device according to an embodiment of the disclosure.

Figure 2B:
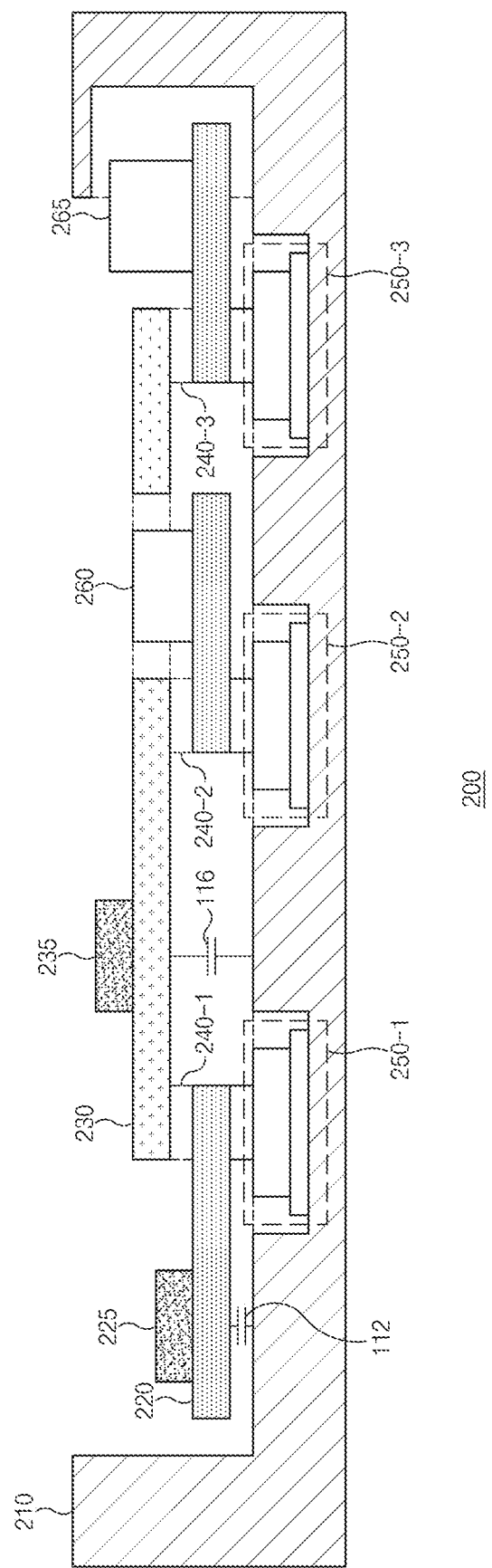
FIG. 2B illustrates an internal structure included in an electronic device according to an embodiment of the disclosure.

FIG. 2B illustrates an internal structure included in an electronic device according to an embodiment of the disclosure. An internal structure illustrated in FIG. 2B may be understood as a sectional view of an electronic device 200 taken along a line A-A' of FIG. 2A.

In various embodiments, the electronic device 200 (e.g., the electronic device 100 of FIG. 1A) may further include circuit board modules (e.g., first circuit board module 260 and second circuit board module 265. For example, each of the first and second circuit board modules 260 and 265 may be referenced as a part in which a circuit board and a part (e.g., a camera) disposed on the circuit board are modularized. The first and second circuit board modules 260 and 265 may form the capacitive coupling with a metal bracket 210 (e.g., the conductive support member 110 of FIG. 1A) through second and third ground structures 250-2 and 250-3.

Referring to FIGS. 2A and 2B, a first circuit board 220 (e.g., the first circuit board 120 of FIG. 1A) and a second circuit board 230 (e.g., the second circuit board 130 of FIG. 1A) may be electrically connected by a first connector 240-1 (e.g., the conductive connection member 140 of FIG. 1A). The second circuit board 230 may be electrically connected to the first circuit board module 260 by a second connector 240-2. The second circuit board 230 and the second circuit board module 265 may be electrically connected by a third connector 240-3. For example, the second circuit board 230 may be referenced as a main PCB.

The electronic device 200 may include a first ground structure 250-1, the second ground structure 250-2, and the third ground structure 250-3 respectively corresponding to the first connector 240-1, the second connector 240-2, and the third connector 240-3. The first circuit board 220, the second circuit board 230, the first circuit board module 260, and the second circuit board module 265 may have substantially the same ground potential.

In various embodiments, an antenna module 225 (e.g., a 5G antenna module) may be disposed in the first circuit board 220 (e.g., a sub-PCB) of the electronic device 200, and a communication circuit 235 may be disposed in the second circuit board 230 (e.g., a main PCB). The communication circuit 235 may transmit an RF signal to the antenna module 225 through the first connector 240-1. The antenna module 225 may transmit a received RF signal to the communication circuit 235 through the first connector 240-1. Since the first circuit board 220, the antenna module 225, the second circuit board 230, and the communication circuit 235 have the same ground potential, the performance of the antenna module 225 and the communication circuit 235 may be optimized.

A high-frequency noise or an electrostatic component which may come from the first circuit board module 260 and the second circuit board module 265 may be discharged to the metal bracket 210 by the second ground structure 250-2 and the third ground structure 250-3. In the case where the electronic device 200 includes a plurality of circuit boards, the circuit board modules may be connected to the second circuit board 230 in the electronic device 200 by the second and third connectors 240-2 and 240-3. As the second and third ground structures 250-2 and 250-3 contacting the second and third connectors 240-2 and 240-3 are newly added, a ground potential of the first and second circuit board modules 260 and 265 newly included may be set to be substantially equal to a ground potential of the second circuit board 230 in the electronic device 200.

In various embodiments, at least a portion of the metal bracket 210 may form a portion of a housing of the electronic device 200. For example, at least a portion of the metal bracket 210 may form a side surface (e.g., a bezel area) of the housing.

Figure 3:
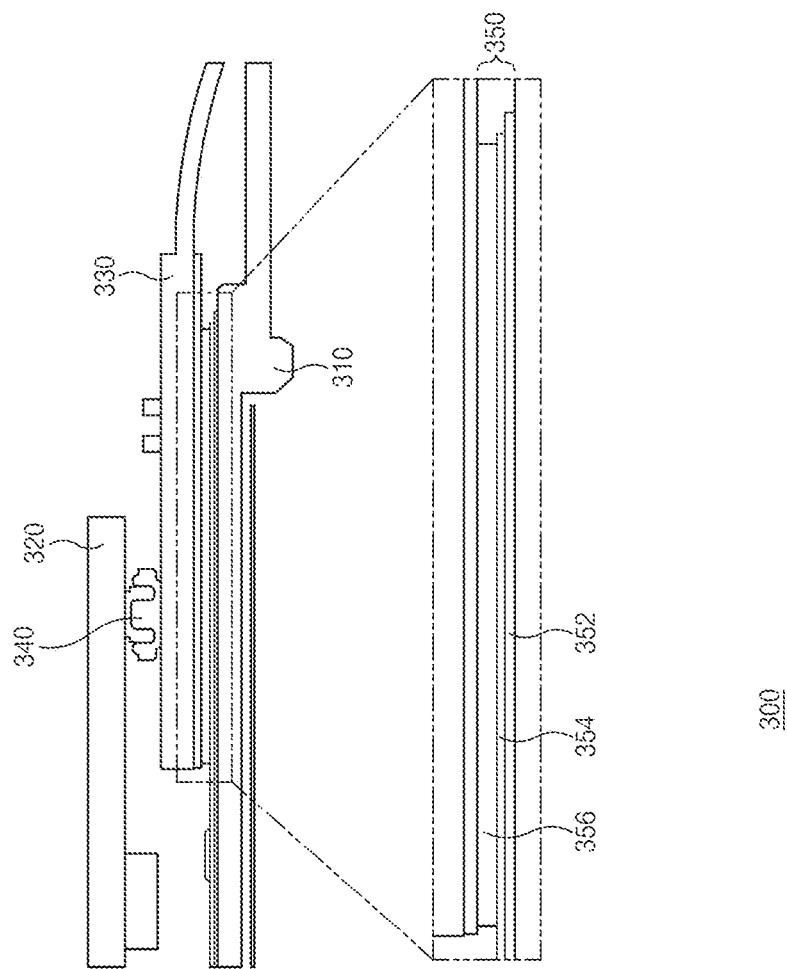
FIG. 3 illustrates an internal structure of an electronic device including a main printed circuit board (PCB) and a sub-PCB, according to an embodiment of the disclosure.
Figure 3:
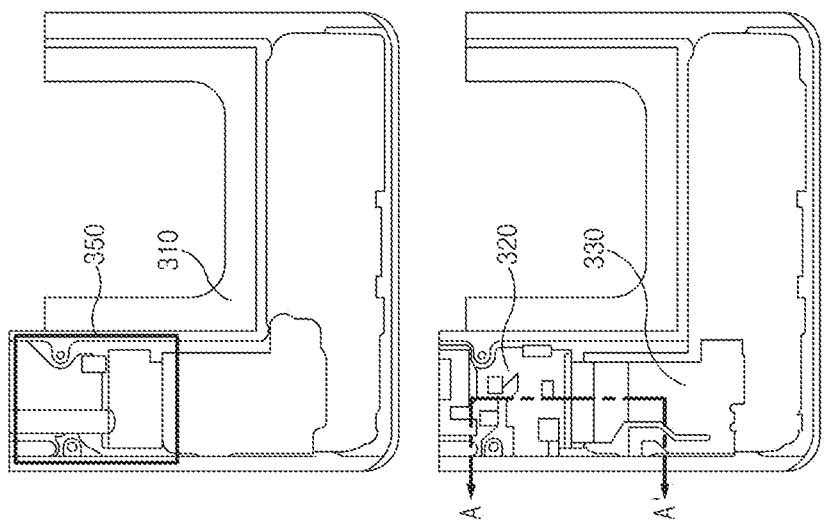

FIG. 3 illustrates an internal structure of an electronic device including a main PCB and a sub-PCB, according to an embodiment of the disclosure. An actual application example of a ground structure according to an embodiment of the inventive concept is illustrated in FIG. 3.

Referring to FIG. 3, an electronic device 300 according to an embodiment may include a metal bracket 310 (e.g., the conductive support member 110 of FIG. 1A), a main PCB 320 (e.g., the first circuit board 120 of FIG. 1A), a sub-PCB 330 (e.g., the second circuit board 130 of FIG. 1A), a connector 340 (e.g., the conductive connection member 140 of FIG. 1A) connecting the main PCB 320 and the sub-PCB 330, and a ground structure 350 (e.g., the ground structure 150 of FIG. 1A). In FIG. 3, the right side structure may be understood as a sectional view of the electronic device 300 taken along a line A-A' of the left side structure of FIG. 3.

In an embodiment, the main PCB 320 may be disposed in a first area over the metal bracket 310 and may be connected to the metal bracket 310 by a first capacitor. The sub-PCB 330 may be disposed in a second area over the metal bracket 310 and may be connected to the metal bracket 310 by a second capacitor.

In an embodiment, at least a portion of the ground structure 350 may be interposed between the connector 340 and the metal bracket 310. The ground structure 350 may include a conductive layer 354 and a non-conductive layer 352. The conductive layer 354 may electrically contact the connector 340. For example, the conductive layer 354 may electrically contact the connector 340 by a conductive tape 356. In another embodiment, as one surface of the connector 340 is formed of a conductive material and contacts the conductive layer 354, the connector 340 may be electrically connected to the conductive layer 354. The non-conductive layer 352 may be stacked and disposed under the conductive layer 354. The non-conductive layer 352 may physically contact the metal bracket 310. The main PCB 320 and the sub-PCB 330 may have substantially the same ground potential.

Figure 4:
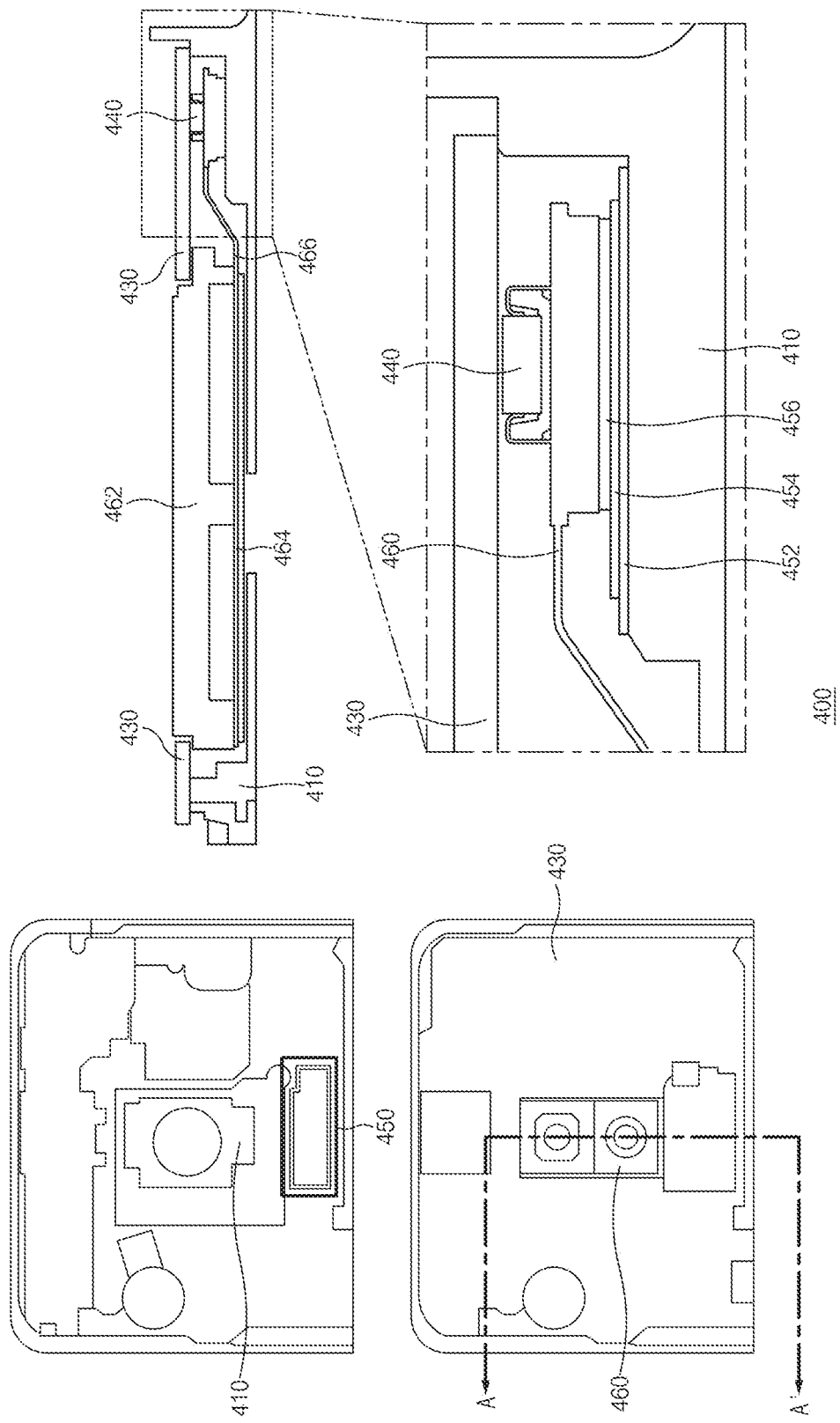
FIG. 4 illustrates an internal structure of an electronic device including a camera module and a PCB, according to an embodiment of the disclosure.

FIG. 4 illustrates an internal structure of an electronic device including a camera module and a PCB, according to an embodiment of the disclosure. An actual application example of a ground structure according to an embodiment of the inventive concept is illustrated in FIG. 4.

Referring to FIG. 4, an electronic device 400 (e.g., the electronic device 200 of FIG. 2A) according to an embodiment may include a metal bracket 410 (e.g., the metal bracket 210 of FIG. 2A), a PCB 430 (e.g., the second circuit board 230 of FIG. 2A), a camera module 460 (e.g., the first circuit board module 260 of FIG. 2A), a connector 440 (e.g., the second connector 240-2 of FIG. 2A) connecting the PCB 430 and the camera module 460, and a ground structure 450 (e.g., the second ground structure 250-2 of FIG. 2A). In FIG. 4, the right side structure may be understood as a sectional view of the electronic device 400 taken along a line A-A' of the left side structure of FIG. 4.

In an embodiment, the camera module 460 may include a camera 462, a PCB 464, and a flexible printed circuit board (FPCB) 466. The PCB 464 may include a ground area, and the camera 462 may be electrically connected to the ground area. The connector 440 may be disposed at one end of the FPCB 466.

In an embodiment, the PCB 430 may be disposed in a first area over the metal bracket 410 and may be connected to the metal bracket 410 by a first capacitor. The camera module 460 may be disposed in a second area over the metal bracket 410 and may be connected to the metal bracket 410 by a second capacitor.

In an embodiment, at least a portion of the ground structure 450 may be interposed between the connector 440 and the metal bracket 410. The ground structure 450 may include a conductive layer 454 and a non-conductive layer 452. The conductive layer 454 may electrically contact the connector 440. For example, the conductive layer 454 may electrically contact the connector 440 by a conductive tape 456. The non-conductive layer 452 may be stacked and disposed under the conductive layer 454. The non-conductive layer 452 may physically contact the metal bracket 410. The PCB 430, the camera 462 of the camera module 460, and the PCB 464 of the camera module 460 may all have substantially the same ground potential.

Figure 5:
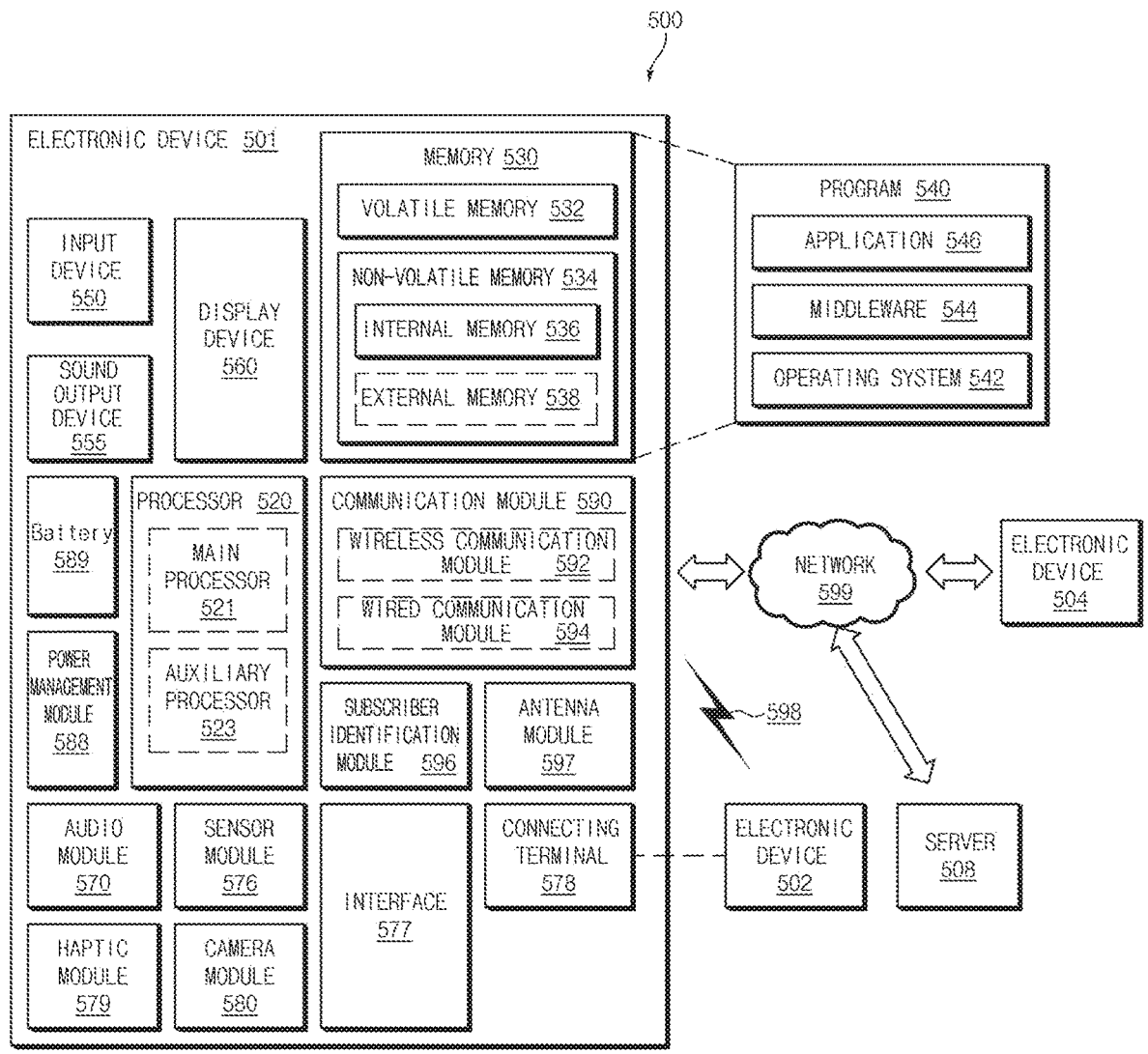
FIG. 5 illustrates an electronic device in a network environment according to an embodiment of the disclosure.

FIG. 5 is a block diagram illustrating an electronic device 501 in a network environment according to an embodiment of the disclosure.

Referring to FIG. 5, the electronic device 501 in a network environment 500 may communicate with an external electronic device 502 via a first network 598 (e.g., a short-range wireless communication network), or an external electronic device 504 or a server 508 via a second network 599 (e.g., a long-range wireless communication network). According to an embodiment, the electronic device 501 may communicate with the external electronic device 504 via the server 508. According to an embodiment, the electronic device 501 may include a processor 520, a memory 530, an input device 550, a sound output device 555, a display device 560, an audio module 570, a sensor module 576, an interface 577, a haptic module 579, a camera module 580, a power management module 588, a battery 589, a communication module 590, a subscriber identification module (SIM) 596, or an antenna module 597. In some embodiments, at least one (e.g., the display device 560 or the camera module 580) of the components may be omitted from the electronic device 501, or one or more other components may be added in the electronic device 501. In some embodiments, some of the components may be implemented as single integrated circuitry. For example, the sensor module 576 (e.g., a fingerprint sensor, an iris sensor, or an illuminance sensor) may be implemented as embedded in the display device 560 (e.g., a display).

The processor 520 may execute, for example, software (e.g., a program 540) to control at least one other component (e.g., a hardware or software component) of the electronic device 501 coupled with the processor 520, and may perform various data processing or computation. According to one embodiment, as at least part of the data processing or computation, the processor 520 may load a command or data received from another component (e.g., the sensor module 576 or the communication module 590) in a volatile memory 532, process the command or the data stored in the volatile memory 532, and store resulting data in a non-volatile memory 534. According to an embodiment, the processor 520 may include a main processor 521 (e.g., a central processing unit (CPU) or an AP), and an auxiliary processor 523 (e.g., a graphics processing unit (GPU), an image signal processor (ISP), a sensor hub processor, or a communication processor (CP)) that is operable independently from, or in conjunction with, the main processor 521. Additionally or alternatively, the auxiliary processor 523 may be adapted to consume less power than the main processor 521, or to be specific to a specified function. The auxiliary processor 523 may be implemented as separate from, or as part of the main processor 521.

The auxiliary processor 523 may control at least some of functions or states related to at least one component (e.g., the display device 560, the sensor module 576, or the communication module 590) among the components of the electronic device 501, instead of the main processor 521 while the main processor 521 is in an inactive (e.g., sleep) state, or together with the main processor 521 while the main processor 521 is in an active state (e.g., executing an application). According to an embodiment, the auxiliary processor 523 (e.g., an ISP or a CP) may be implemented as part of another component (e.g., the camera module 580 or the communication module 590) functionally related to the auxiliary processor 523.

The memory 530 may store various data used by at least one component (e.g., the processor 520 or the sensor module 576) of the electronic device 501. The various data may include, for example, software (e.g., the program 540) and input data or output data for a command related thereto. The memory 530 may include the volatile memory 532 or the non-volatile memory 534.

The program 540 may be stored in the memory 530 as software, and may include, for example, an operating system (OS) 542, middleware 544, or an application 546.

The input device 550 may receive a command or data to be used by other component (e.g., the processor 520) of the electronic device 501, from the outside (e.g., a user) of the electronic device 501. The input device 550 may include, for example, a microphone, a mouse, or a keyboard.

The sound output device 555 may output sound signals to the outside of the electronic device 501. The sound output device 555 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 560 may visually provide information to the outside (e.g., a user) of the electronic device 501. The display device 560 may include, for example, a display, a hologram device, or a projector and control circuitry to control a corresponding one of the display, hologram device, and projector. According to an embodiment, the display device 560 may include touch circuitry adapted to detect a touch, or sensor circuitry (e.g., a pressure sensor) adapted to measure the intensity of force incurred by the touch.

The audio module 570 may convert a sound into an electrical signal and vice versa. According to an embodiment, the audio module 570 may obtain the sound via the input device 550, or output the sound via the sound output device 555 or a headphone of an external electronic device (e.g., external electronic device 502) directly (e.g., wiredly) or wirelessly coupled with the electronic device 501.

The sensor module 576 may detect an operational state (e.g., power or temperature) of the electronic device 501 or an environmental state (e.g., a state of a user) external to the electronic device 501, and then generate an electrical signal or data value corresponding to the detected state. According to an embodiment, the sensor module 576 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 577 may support one or more specified protocols to be used for the electronic device 501 to be coupled with the external electronic device (e.g., the external electronic device 502) directly (e.g., wiredly) or wirelessly. According to an embodiment, the interface 577 may include, for example, a high definition multimedia interface (HDMI), a universal serial bus (USB) interface, a secure digital (SD) card interface, or an audio interface.

A connecting terminal 578 may include a connector via which the electronic device 501 may be physically connected to the external electronic device (e.g., the external electronic device 502). According to an embodiment, the connecting terminal 578 may include, for example, a HDMI connector, a USB connector, a SD card connector, or an audio connector (e.g., a headphone connector).

The haptic module 579 may convert an electrical signal into a mechanical stimulus (e.g., a vibration or a movement) or electrical stimulus which may be recognized by a user via his tactile sensation or kinesthetic sensation. According to an embodiment, the haptic module 579 may include, for example, a motor, a piezoelectric element, or an electric stimulator.

The camera module 580 may capture a still image or moving images. According to an embodiment, the camera module 580 may include one or more lenses, image sensors, ISPs, or flashes.

The power management module 588 may manage power supplied to the electronic device 501. According to one embodiment, the power management module 588 may be implemented as at least part of, for example, a power management integrated circuit (PMIC).

The battery 589 may supply power to at least one component of the electronic device 501. According to an embodiment, the battery 589 may include, for example, a primary cell which is not rechargeable, a secondary cell which is rechargeable, or a fuel cell.

The communication module 590 may support establishing a direct (e.g., wired) communication channel or a wireless communication channel between the electronic device 501 and the external electronic device (e.g., the external electronic device 502, the external electronic device 504, or the server 508) and performing communication via the established communication channel. The communication module 590 may include one or more CPs that are operable independently from the processor 520 (e.g., the AP) and supports a direct (e.g., wired) communication or a wireless communication. According to an embodiment, the communication module 590 may include a wireless communication module 592 (e.g., a cellular communication module, a short-range wireless communication module, or a global navigation satellite system (GNSS) communication module) or a wired communication module 594 (e.g., a local area network (LAN) communication module or a power line communication (PLC) module). A corresponding one of these communication modules may communicate with the external electronic device via the first network 598 (e.g., a short-range communication network, such as Bluetooth™, wireless-fidelity (Wi-Fi) direct, or infrared data association (IrDA)) or the second network 599 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 592 may identify and authenticate the electronic device 501 in a communication network, such as the first network 598 or the second network 599, using subscriber information (e.g., international mobile subscriber identity (IMSI)) stored in the subscriber identification module 596.

The antenna module 597 may transmit or receive a signal or power to or from the outside (e.g., the external electronic device) of the electronic device 501. According to an embodiment, the antenna module 597 may include one or more antennas, and, therefrom, at least one antenna appropriate for a communication scheme used in the communication network, such as the first network 598 or the second network 599, may be selected, for example, by the communication module 590 (e.g., the wireless communication module 592). The signal or the power may then be transmitted or received between the communication module 590 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 501 and the external electronic device 504 via the server 508 coupled with the second network 599. Each of the external electronic devices 502 and 504 may be a device of a same type as, or a different type, from the electronic device 501. According to an embodiment, all or some of operations to be executed at the electronic device 501 may be executed at one or more of the external electronic devices 502 and 504 or the server 508. For example, if the electronic device 501 should perform a function or a service automatically, or in response to a request from a user or another device, the electronic device 501, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 501. The electronic device 501 may provide the outcome, with or without further processing of the outcome, as at least part of a reply to the request. To that end, a cloud computing, distributed computing, or client-server computing technology may be used, for example.

An electronic device (e.g., the electronic device 100 of FIG. 1A) may include a metal bracket (e.g., the conductive support member 110 of FIG. 1A), a first circuit board (e.g., the first circuit board 120) disposed over a first area of the metal bracket, a second circuit board (e.g., the second circuit board 130 of FIG. 1A) disposed over a second area of the metal bracket and electrically connected to a connection part (e.g., the conductive connection member 140 of FIG. 1A) of the first circuit board, and a conductive member (e.g., the conductive layer 154 of FIG. 1A) disposed in the metal bracket to face the connection part in an area where the first area and the second area overlap each other. The conductive member may be electrically separated from the metal bracket such that a capacitive coupling is formed between the conductive member and the metal bracket. The conductive member may be electrically connected to the connection part such that a first potential difference between a first ground of the first circuit board and the metal bracket and a second potential difference between a second ground of the second circuit board and the metal bracket are substantially identical.

The connection part of the electronic device (e.g., the electronic device 100 of FIG. 1A) according to an embodiment may include a connector (e.g., the conductive connection member 140 of FIG. 1A) disposed on one surface of the first circuit board and electrically connected to the second circuit board.

The electronic device (e.g., the electronic device 100 of FIG. 1A) according to an embodiment may further include a non-conductive member (e.g., the non-conductive member 152 of FIG. 1A) interposed between the conductive member and the metal bracket for the purpose of electrically separating the metal bracket and the conductive member.

The conductive member and the non-conductive member of the electronic device (e.g., the electronic device 100 of FIG. 1A) according to an embodiment may constitute a ground structure associated with the first circuit board, the second circuit board, and the connection part.

At least a portion of the metal bracket (e.g., the conductive support member 110 of FIG. 1A) of the electronic device according to an embodiment may form at least a portion of the exterior of the electronic device.

The electronic device according to an embodiment may further include a metal housing, and the metal bracket may be electrically connected to the metal housing.

An electronic device (e.g., the electronic device 100 of FIG. 1A) according to an embodiment may include a metal bracket (e.g., the conductive support member 110 of FIG. 1A), a first circuit board (e.g., the first circuit board 120 of FIG. 1A) disposed over the metal bracket, a second circuit board (e.g., the second circuit board 130) disposed over the metal bracket and electrically connected to a connection part (e.g., the conductive connection member 140 of FIG. 1A) of the first circuit board, and a conductive member (e.g., the conductive layer 154 of FIG. 1A) disposed between the bracket and the first circuit board to face the connection part and electrically separated from the bracket. The conductive member may be electrically connected to the connection part such that a first potential difference between a first ground of the first circuit board and the bracket and a second potential difference between a second ground of the second circuit board and the bracket are substantially identical.

An electronic device (e.g., the electronic device 100 of FIG. 1A) according to an embodiment may include a metal bracket (e.g., the conductive support member 110 of FIG. 1A), a first circuit board (e.g., the first circuit board 120 of FIG. 1A) disposed over a first area of the metal bracket, a second circuit board (e.g., the second circuit board 130) disposed over a second area of the metal bracket and electrically connected to a connection part (e.g., the conductive connection member 140 of FIG. 1A) of the first circuit board, and a conductive member (e.g., the conductive layer 154 of FIG. 1A) disposed to face the connection part in an area where the first area and the second area overlap each other. The conductive member may be electrically separated from the bracket such that a capacitive coupling is formed between the conductive member and the bracket.

An electronic device (e.g., the electronic device 100 of FIG. 1A) according to an embodiment may include a conductive support member (e.g., the conductive support member 110 of FIG. 1A), a first circuit board (e.g., the first circuit board 120 of FIG. 1A) connected to the conductive support member by a first capacitor, a second circuit board (e.g., the second circuit board 130 of FIG. 1A) connected to the conductive support member by a second capacitor, a first conductive connection member (e.g., the conductive connection member 140 of FIG. 1A) electrically connecting the first circuit board and the second circuit board, and a first ground structure (e.g., the ground structure 150 of FIG. 1A), at least a portion of which is interposed between the first conductive connection member and the conductive support member. The first ground structure may include a non-conductive layer (e.g., the non-conductive layer 152 of FIG. 1A) physically contacting the conductive support member, and a conductive layer (e.g., the conductive layer 154 of FIG. 1A) electrically connected to the first conductive connection member to form a capacitive coupling with the conductive support member.

The conductive layer of the electronic device (e.g., the electronic device 100 of FIG. 1A) according to an embodiment may electrically contact the first conductive connection member by a conductive tape attached to the first conductive connection member.

The conductive layer of the electronic device (e.g., the electronic device 100 of FIG. 1A) according to an embodiment may be stacked and disposed on the non-conductive layer.

The first ground structure of the electronic device (e.g., the electronic device 100 of FIG. 1A) according to an embodiment may be formed with a size which allows the first circuit board and the second circuit board to have substantially an equal ground potential.

The first circuit board of the electronic device (e.g., the electronic device 100 of FIG. 1A) according to an embodiment may include a first ground area, the second circuit board may include a second ground area, and the first ground area and the second ground area may be electrically connected by the first conductive connection member.

The first conductive connection member of the electronic device according to an embodiment may be a connector.

At least a portion of the conductive support member of the electronic device according to an embodiment may form at least a portion of a housing of the electronic device which forms at least a portion of the exterior of the electronic device.

The electronic device according to an embodiment may further include a circuit board circuitry (e.g., the first circuit board module 260 of FIG. 2B) including a third circuit board and a part such that the circuit board circuitry is connected to the conductive support member through a third capacitor, a second conductive connection member (e.g., the third connector 240-3 of FIG. 2B) electrically connecting the circuit board circuitry and the second circuit board, and a second ground structure (e.g., the second ground structure 250-2 of FIG. 2B), at least a portion of which is interposed between the second conductive connection member and the conductive support member.

The conductive support member of the electronic device according to an embodiment may include a recess corresponding to the first ground structure, and the first ground structure is placed in the recess.

An electronic device (e.g., the electronic device 100 of FIG. 1A) according to an embodiment may include a metal bracket (e.g., the conductive support member 110 of FIG. 1A), a first circuit board (e.g., the first circuit board 120 of FIG. 1A) disposed in a first area over the metal bracket and connected to the metal bracket by a first capacitor (e.g., the first capacitor 112 of FIG. 1A), a first part (e.g., the first part 125 of FIG. 1A) disposed over the first circuit board and connected to a first ground of the first circuit board, a second circuit board (e.g., the second circuit board 130 of FIG. 1A) disposed in a second area over the metal bracket and connected to the metal bracket by a second capacitor (e.g., the second capacitor 116 of FIG. 1A), a second part (e.g., the second part 135 of FIG. 1A) disposed over the second circuit board and connected to a second ground of the second circuit board, a connector (e.g., the conductive connection member 140 of FIG. 1A) electrically connecting the first circuit board and the second circuit board, and a ground structure (e.g., the ground structure 150 of FIG. 1A), at least a portion of which is interposed between the connector and the metal bracket. The ground structure may include a conductive layer (e.g., the conductive layer 154 of FIG. 1A) electrically contacting the connector, and a non-conductive layer (e.g., the non-conductive layer 152 of FIG. 1A) disposed under the conductive layer and physically contacting the metal bracket.

The first ground and the second ground of the electronic device according to an embodiment may be electrically connected by the connector.

The electronic device according to an embodiment may further include a conductive housing forming at least a portion of the exterior of the electronic device, and at least a portion of the metal bracket may form at least a portion of the conductive housing.

The conductive layer of the electronic device according to an embodiment may electrically contact the connector by a conductive tape (e.g., the conductive tape 156 of FIG. 1A) attached to the connector.

The first circuit board, the first part, the second circuit board, and the second part of the electronic device according to an embodiment may have substantially an equal ground potential.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected to," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 540) including one or more instructions that are stored in a storage medium (e.g., internal memory 536 or external memory 538) that is readable by a machine (e.g., the electronic device 501). For example, a processor (e.g., the processor 520) of the machine (e.g., the electronic device 501) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a metal bracket;
   a first circuit board disposed over a first area of the metal bracket;
   a second circuit board disposed over a second area of the metal bracket;
   a conductive connection member disposed on one surface of the first circuit board and electrically connecting the first circuit board to the second circuit board in an area where the first circuit board and the second circuit board overlap each other, the one surface of the first circuit board facing one surface of the second circuit board in the area where the first circuit board and the second circuit board overlap;
   a conductive member disposed in the metal bracket to face the conductive connection member; and
   a non-conductive member interposed between the conductive member and the metal bracket to electrically separate the metal bracket from the conductive member,
   wherein the conductive member is electrically separated from the metal bracket such that a first capacitive coupling is formed between the conductive member and the metal bracket,
   wherein the conductive member is electrically connected to the conductive connection member such that a first potential difference between a first ground of the first circuit board and the metal bracket and a second potential difference between a second ground of the second circuit board and the metal bracket are substantially identical, and
   wherein a second capacitive coupling is formed between the metal bracket and a ground structure comprising the non-conductive member.

2. The electronic device of claim 1,
   wherein a high-frequency noise or an electrostatic discharge (ESD) occurs in a region where the first circuit board and the second circuit board are connected by the conductive connection member, and wherein the high-frequency noise or static electricity is discharged to the metal bracket through the second capacitive coupling formed between the ground structure of the electronic device and the metal bracket.

3. The electronic device of claim 1, wherein the conductive member and the non-conductive member constitute the ground structure associated with each of the first circuit board, the second circuit board, and the conductive connection member.

4. The electronic device of claim 1, wherein at least a portion of the metal bracket forms at least a portion of an exterior of the electronic device.

5. The electronic device of claim 1, further comprising: a metal housing,
wherein the metal bracket is electrically connected to the metal housing.

6. An electronic device comprising:
a conductive support member;
a first circuit board connected to the conductive support member by a first capacitor;
a second circuit board connected to the conductive support member by a second capacitor;
a first conductive connection member electrically connecting the first circuit board and the second circuit board; and
a first ground structure, at least a portion of the first ground structure being interposed between the first conductive connection member and the conductive support member,
wherein the first ground structure comprises:
a non-conductive layer physically contacting the conductive support member, and
a conductive layer electrically connected to the first conductive connection member to form a capacitive coupling with the conductive support member.

7. The electronic device of claim 6, wherein the conductive layer electrically contacts the first conductive connection member by a conductive tape attached to the first conductive connection member.

8. The electronic device of claim 7, wherein the conductive layer is stacked and disposed on the non-conductive layer.

9. The electronic device of claim 6, wherein the first ground structure is formed with a size which allows the first circuit board and the second circuit board to have substantially an equal ground potential.

10. The electronic device of claim 6,
wherein the first circuit board comprises a first ground area,
wherein the second circuit board comprises a second ground area, and
wherein the first ground area and the second ground area are electrically connected by the first conductive connection member.

11. The electronic device of claim 10, wherein the first conductive connection member comprises a connector.

12. The electronic device of claim 6,
wherein at least a portion of the conductive support member forms at least a portion of a housing of the electronic device, and
wherein the housing forms at least a portion of an exterior of the electronic device.

13. The electronic device of claim 6, further comprising:
a circuit board circuitry comprising a third circuit board and a part, the circuit board circuitry being connected to the conductive support member through a third capacitor;
a second conductive connection member electrically connecting the circuit board circuitry and the second circuit board; and
a second ground structure, at least a portion of which is interposed between the second conductive connection member and the conductive support member.

14. The electronic device of claim 6,
wherein the conductive support member comprises a recess corresponding to the first ground structure, and
wherein the first ground structure is placed in the recess.

15. An electronic device comprising:
a metal bracket;
a first circuit board disposed in a first area over the metal bracket and connected to the metal bracket by a first capacitor;
a first part disposed over the first circuit board and connected to a first ground of the first circuit board;
a second circuit board disposed in a second area over the metal bracket and connected to the metal bracket by a second capacitor;
a second part disposed over the second circuit board and connected to a second ground of the second circuit board;
a connector electrically connecting the first circuit board and the second circuit board; and
a ground structure, at least a portion of the ground structure being interposed between the connector and the metal bracket,
wherein the ground structure comprises:
a conductive layer electrically contacting the connector, and
a non-conductive layer disposed under the conductive layer and physically contacting the metal bracket.

16. The electronic device of claim 15, wherein the first ground and the second ground are electrically connected by the connector.

17. The electronic device of claim 15, further comprising:
a conductive housing forming at least a portion of an exterior of the electronic device,
wherein at least a portion of the metal bracket forms at least a portion of the conductive housing.

18. The electronic device of claim 15, wherein the conductive layer electrically contacts the connector by a conductive tape attached to the connector.

19. The electronic device of claim 15, wherein the first circuit board, the first part, the second circuit board, and the second part comprise substantially an equal ground potential.

20. The electronic device of claim 1, wherein, in a stacking direction, the one surface of the first circuit board comprises a top surface of the first circuit board and the one surface of the second circuit board comprises a bottom surface of the second circuit board.

21. The electronic device of claim 1,
wherein the metal bracket comprises a recess corresponding to the ground structure, and
wherein the ground structure is placed in the recess.

* * * * *